United States Patent [19]
Olsen

[11] Patent Number: 5,614,832
[45] Date of Patent: Mar. 25, 1997

[54] HIGH VOLTAGE PROTECTED OHMMETER

[75] Inventor: Floyd W. Olsen, Athens, Pa.

[73] Assignee: International Business Machines Corporation, Armonk, N.Y.

[21] Appl. No.: 461,571

[22] Filed: Jun. 2, 1995

[51] Int. Cl.$^6$ .................................................. G01R 27/26
[52] U.S. Cl. .......................................... 324/705; 324/713
[58] Field of Search .................................. 324/705, 713, 324/704, 716; 340/660, 661

[56] References Cited

U.S. PATENT DOCUMENTS

| | | |
|---|---|---|
| 3,711,850 | 1/1973 | Kelly . |
| 3,978,402 | 8/1976 | Ryder ...................................... 324/713 |
| 4,020,416 | 4/1977 | Ottos ....................................... 324/705 |
| 4,088,949 | 5/1978 | Goldish ................................... 324/713 |
| 4,160,949 | 7/1979 | McFayden .............................. 324/705 |
| 4,228,394 | 10/1980 | Crosby ..................................... 324/705 |
| 4,298,969 | 11/1981 | Rickenbacker .......................... 324/51 |
| 4,323,972 | 4/1982 | Winter . |
| 4,604,570 | 8/1986 | Thorpe . |
| 4,698,584 | 10/1987 | Morin . |
| 4,841,229 | 6/1989 | Eccleston . |
| 4,887,025 | 12/1989 | Re Fiorentin et al. . |
| 5,121,482 | 6/1992 | Patton .................................... 395/275 |
| 5,144,252 | 9/1992 | Walsworth et al. .................... 324/713 |
| 5,272,445 | 12/1993 | Lloyd et al. ............................ 324/705 |
| 5,351,010 | 9/1994 | Leopold et al. ........................ 324/713 |
| 5,469,071 | 11/1995 | Obata ...................................... 324/705 |

*Primary Examiner*—Maura K. Regan
*Attorney, Agent, or Firm*—Calfee, Halter & Griswold

[57] ABSTRACT

An in-circuit ohmmeter is provided, including a pair of input terminals connectable to a resistance of an unknown value. A pair of current generators are connected electrically in series for generating an electrical current to be passed through the unknown resistance to develop a differential voltage across the input terminals, and a circuit is provided for determining the amount of the electrical current passed through the unknown resistance. A semiconductor switch switches the pair of current generators on and off. A current generator protection circuit comprising a plurality of diodes is connected across the input terminals. A differential amplifier circuit receives and amplifies the differential voltage so that a value of the unknown resistance may be calculated based on the differential voltage and the determined amount of electrical current passed through the resistance. An inverter circuit is disposed intermediate the input terminals and the differential amplifier circuit. The inverter circuit includes an inverter buffer circuit for electrically isolating the inverter circuit from the from input terminals. A pair of resistors and a pair of diodes electrically isolates each of the input terminals from the inverter circuit and the pair of current generators, respectively.

18 Claims, 2 Drawing Sheets

HIGH VOLTAGE PROTECTED OHMMETER

FIELD OF THE INVENTION

The present invention relates generally to devices for measuring electrical resistance and more particularly to an electronic in-circuit ohmmeter which provides internal high voltage protection.

BACKGROUND OF THE INVENTION

An ohmmeter is an instrument for measuring the resistance of a conductor directly in ohms. Typically, measurement of a DC resistance is accomplished by applying a known current to an unknown resistance and measuring the voltage developed across the resistance. The value of the unknown resistance may then be calculated using Ohm's law.

Ohmmeters are known for testing an unknown resistance across input terminals where a "live" voltage potential exists. These types of ohmmeters are known as in-circuit ohmmeters. Such in-circuit ohmmeters, however, may be damaged if the voltage at the input terminals is sufficiently great (e.g. on the order of one or two kilovolts (KV)). Moreover, because typical ohmmeter circuits include only a single current source for generating the current which is applied to the unknown resistance, the current source may be damaged if the polarity of the live voltage encountered at the terminals is opposite that which the current source can handle.

Conventionally, high voltage relays are used to switch the ohmmeter input terminals into and out of the circuit(s) to be tested so as not to damage the ohmmeter. If an excessive voltage is encountered which may damage the ohmmeter, the high voltage relay circuit senses the excessive voltage and electromechanically disconnects the ohmmeter from the circuit under test. The relay connects the ohmmeter to the circuit during intervals of time in which no excessive voltage will be applied to the ohmmeter input terminals.

The additional requirement of high voltage relay in a typical in-circuit ohmmeter, however, requires additional ohmmeter circuit components in the form of the high voltage relay. Moreover, this additional relay adds operational time to the ohmmeter circuit, as typical high voltage relays take on the order of between 20–30 milliseconds (ms) to switch the ohmmeter into and out of the circuit under test. Moreover, electromechanical disconnect relays are subject to inconsistent operation and failure.

Accordingly it is an object of the present invention to provide an accurate and reliable in-circuit ohmmeter which does not utilize electromechanical relays, which provides protection against high voltage encountered at its input terminals, and which permits rapid in-circuit operation regardless of the polarity of voltage experienced at the input terminals.

SUMMARY OF THE INVENTION

An in-circuit ohmmeter is provided, including a pair of input terminals connectable to a resistance of an unknown value. A pair of current generators are connected electrically in series for generating an electrical current to be passed through the unknown resistance to develop a differential voltage across the input terminals, and a circuit is provided for determining the amount of the electrical current passed through the unknown resistance. A semiconductor switch switches the pair of current generators on and off. A current generator protection circuit comprising a plurality of diodes is connected across the input terminals.

A differential amplifier circuit receives and amplifies the differential voltage so that a value of the unknown resistance may be calculated based on the differential voltage and the determined amount of electrical current passed through the resistance. An inverter circuit is disposed intermediate the input terminals and the differential amplifier circuit. The inverter circuit includes an inverter buffer circuit for electrically isolating the inverter circuit from the from input terminals. A pair of resistors and a pair of diodes electrically isolates each of the input terminals from the inverter circuit and the pair of current generators, respectively.

DETAILED DESCRIPTION OF THE PREFERRED EMBODIMENT

Figure 1A:
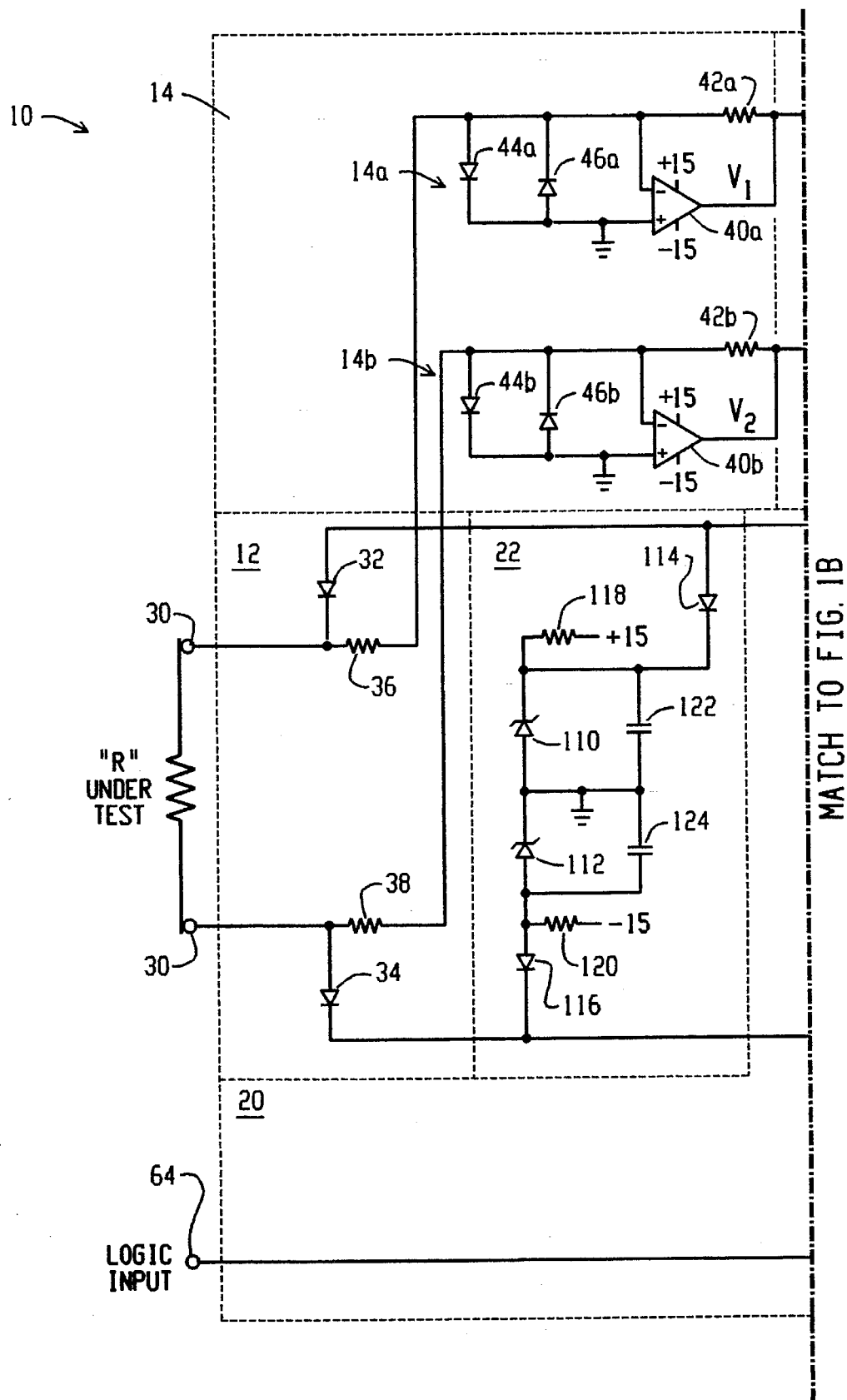
FIGS. 1A and 1B, taken together, show a schematic of an electronic circuit embodiment of a high voltage protected in-circuit ohmmeter constructed according to the principles of the present invention.
Figure 1B:
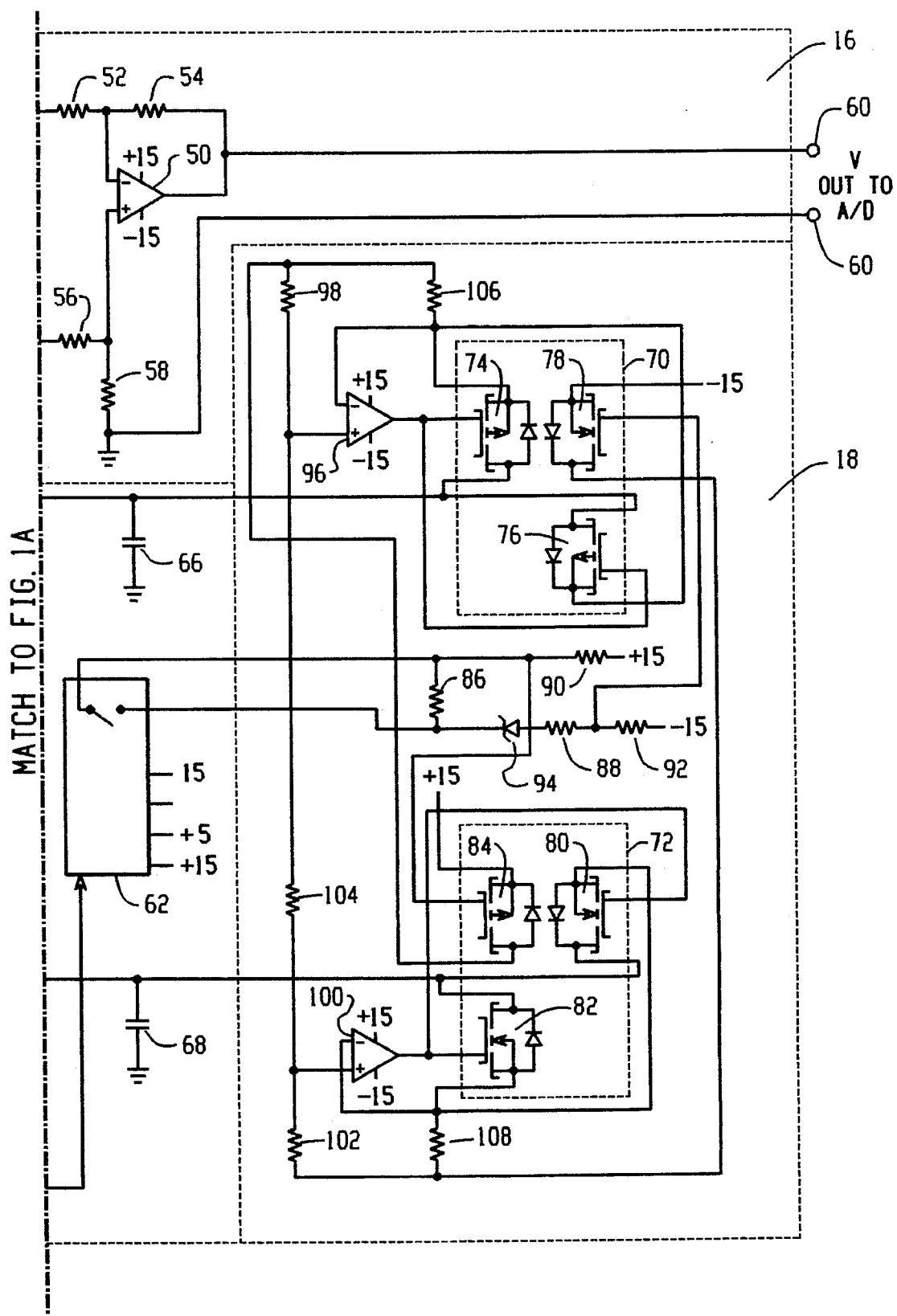

A circuit 10 of a preferred embodiment of the present invention is shown in FIGS. 1A and 1B. The circuit 10 provides a means for in-circuit determination of the value of an unknown resistance "R" connected to input terminals of the circuit, regardless of the polarity of voltage present across the resistance "R". The circuit also includes means for protecting the circuit from damage which might otherwise be caused by the presence of high voltage present at the input terminals.

The circuit 10 is comprised of several interconnected circuits, each of which performs a particular function in the circuit 10. These circuits include (i) an isolation circuit 12; (ii) a buffered inversion circuit 14; (iii) a differential amplifier circuit 16; (iv) a current generation circuit 18; (v) an enable circuit 20 for the current generation circuit; and (vi) a protection circuit 22 for the current generation circuit. The buffered inversion circuit 14 comprises a pair of identical parallel buffered inversion circuits 14a and 14b.

The isolation circuit 12 includes a pair of input terminals 30, a pair of isolation diodes 32, 34, and a pair of isolation resistors 36, 38. The diodes 32, 34 in the disclosed embodiment are type MUR-900, fast recovery diodes and the resistors 36, 38 are 160 KΩ high voltage resistors. The diodes 32 and 34 isolate and protect the current generation circuit 18 from high voltage present at the input terminals 30, and the resistors 36 and 38 protect the buffered inversion circuits 14a and 14b, respectively, from high voltage present at the input terminals 30. The resistors 36 and 38 may be located remote from the circuit 10 at the location of the resistance "R" being tested.

The unknown resistance "R" is connected across the input terminals 30. As will be explained herein in further detail, the unknown resistance "R" is measured by first generating a known value of electrical current which is allowed to flow through the unknown resistance "R". In the particular design of the circuit 10 of FIGS. 1A and 1B, one volt is developed across the input terminals 30 for every 10 Ω of unknown resistance. Because the amount of current flowing through the unknown resistance is known, the value of the unknown resistance in ohms may be calculated by dividing the voltage developed across the input terminals by the known current, and multiplying by 10.

Immediately upon taking a resistance measurement, 100 milliamps of current flows through the diodes 32 and 34. Because these diodes are fast recovery type diodes, the conduction path between the diodes and the current generation circuit ceases to exist immediately after the 100 milliamps provided by current generation circuit 18 stops. In this manner, the diodes 32 and 34 isolate the resistance "R" under test from the current generation circuit 18.

The buffered inversion circuits 14a and 14b read the voltage present at the right sides of resistors 36 and 38 opposite the input terminals 30, invert the voltages, and provide these inverted output voltages ($V_1$ and $V_2$) to the differential amplifier circuit 16. Buffered inversion circuit 14a comprises an operational amplifier 40a, a feedback resistor 42a connected across the output and the inverting input of the amplifier 40a, and a pair of diodes 44a and 46a connected in parallel across the inverting and non-inverting inputs of the amplifier 40a. Similarly, buffered inversion circuit 14b comprises an operational amplifier 40b, a feedback resistor 42b connected across the output and the inverting input of the amplifier 40b, and a pair of diodes 44b and 46b connected in parallel across the inverting and non-inverting inputs of the amplifier 40b.

In the disclosed embodiment, the operational amplifiers 40a and 40b are low input bias current, fast-settling op-amps, the diodes 44a–b and 46a–b are type FD 333 diodes, and the feedback resistors 42a–b are 160 KΩ high precision (0.1%) resistors. The diode pairs 44a–b and 46a–b in circuits 14a and 14b, respectively, connected in parallel and in back-to-front configuration with respect to each other, provide additional protection for the operational amplifiers 40a–40b. These diode pairs clamp the voltages on the right side of each of the isolation resistors 36 and 38 so that these voltages do not exceed those at which the operational amplifiers may safely operate.

Because the value of the feedback resistors 42a–b for the operational amplifiers 40a–b are the same as that of their respective input resistors 36, 38 (160 KΩ) the amplifiers have a unity gain. Accordingly, the output of the circuits 14a and 14b, which is the output of the amplifiers 40a and 40b ($V_1$ and $V_2$ respectively), provides differential voltage inputs to the differential amplifier circuit 16 which are inverted from the voltages present at the right side of resistors 36 and 38. Because the operational amplifiers 40a–b are effectively isolated from the input terminals 30, the buffered inversion circuits 14a, 14b may read the voltage present at these terminals without effectively loading down this voltage.

.As explained above, the resistors 36 and 38 may be located remote from the circuit 10 at the location of the resistance "R" being tested. Because the voltage change at the summing point of inverting op-amps 40a and 40b is essentially zero, the distant location of the resistors 36 and 38 will not cause degradation of the test signal due to capacitive line losses. In this manner, resistance readings may be taken in less than 20 microseconds (μsec).

The differential amplifier circuit 16 comprises an operational amplifier 50 and precision scaling resistors 52, 54, 56 and 58. Like the op-amps 40a and 40b, op-amp 50 is a low input bias current, fast-settling op-amp. In the disclosed circuit embodiment, precision scaling resistors 52 and 56 are 20 KΩ (0.05%), and resistors 54 and 58 are 100 KΩ (0.05%). Because the ratio of the resistances of resistors 52 and 54 (1:5) equals the ratio of the resistances of resistors 56 and 58 (1:5), the output of the differential amplifier 50 is equal to 5 times the voltage differential present at the outputs of amplifiers 40a–40b. The output of differential amplifier 50 is provided at output terminals 60 as $V_{out}$. Specifically:

$$V_{out}=(R54/R52)\times(V_2-V_1)=5\times(V_2-V_1)$$

As shown in FIGS. 1A and 1B, the output $V_{out}$ of the differential amplifier 50 is sent to a conventional analog-to-digital (A/D) converter (not shown), for conversion to a digital voltage signal. The resistance "R" may be calculated by using Ohm's law, given that one volt is developed across the input terminals 30 for every 10 Ω of unknown resistance. Because of the 5× amplification provided by the differential amplifier 50, $V_{out}$ is approximately one volt per every 2 Ω of unknown resistance "R".

As explained above, the current generation circuit 18 provides the current which is allowed to flow through the unknown resistance under test and which develops the voltage across the input terminals 30 which is inverted by the buffered inversion circuit 14 and scaled/amplified by the differential amplifier circuit 16. The current generation circuit is selectively enabled and disabled by the enable circuit 20 of FIG. 1. The enable circuit includes a semiconductor switch 62 (type DG190AP) which is computer controlled by a logic input 64. The switch contacts are normally open. When the state of the logic input 64 is driven active, the switch closes, thereby activating the current generation circuit 18. The logic input can also be used to activate the A/D converter connected to output terminals 60.

As shown in FIGS. 1A and 1B, the enable circuit 20 also includes a pair of capacitors 66, 68 (1 microfarad (μF) each). The purpose of the capacitors is to insure smooth operation of the circuit 10 as the current generation circuit 18 abruptly switches 100 milliamps of current on and off. Because the circuit 10 may effectively read an unknown resistance "R" on the order of only 25 (microseconds) μsec, the enable circuit 20 may switch the current generation circuit 18 on and off up to 40,000 times a second. Accordingly, the 1 μF capacitors 66, 68 facilitate this rapid coupling/decoupling of the current generation circuit, and compensate for high frequency disturbances (ringing) which may result from the inductance of the wires leading to the resistance to be measured, when current is applied to these wires by the current generation circuit.

The current generation circuit 18 includes a current source 70 and a current drain 72, each of which, in the preferred embodiment, is a power MOSFET (metal-oxide semiconductor field effect transistor) type VCO206N7. Current source 70 includes a pair of p-type power field effect transistors (PFETs) 74, 76 and an n-type switching field effect transistor (NFET) 78 (a second NFET on the MOSFET is unused). Current drain 72 includes a pair of power NFETs 80, 82 and a switching PFET 84 (a second PFET on the MOSFET is unused).

The current generation circuit 18 also includes network of resistors including 100 KΩ resistor 86, 1 KΩ resistor 88, and 1.8 KΩ resistors 90 and 92. When the switch 62 is closed to activate the current generation circuit 18, the 100 KΩ resistor 86 is shorted out. A zener diode 94 prevents negative voltages in excess of minus five volts from being applied to the switch 62. With resistor 86 shorted out, a positive voltage is applied to the gate of PFET 84 through resistor 90 to turn on PFET 84. A negative voltage is applied to the gate of NFET 78 through resistor 92 to turn on NFET 78. Switching transistors PFET 84 and NFET 78 are enhancement-type FETs which are operated in the saturation mode.

The source of PFET 84 is connected to the non-inverting input of operational amplifier 96 through precision 8 KΩ resistor 98 (0.05%). Similarly, the source of NFET 78 is connected to the non-inverting input of operational amplifier 100 through a similar precision resistor 102. The non-inverting inputs of the operational amplifiers are connected by a third similar precision resistor 104. Like the op-amps 40a, 40b and 50, op-amps 96 and 100 are low input bias current, fast-settling op-amps.

The sources of PFET 76 and NFET 80 are fed back into the inverting inputs of operational amplifiers 96 and 100 respectively. The operational amplifiers operate to drive their outputs to the level at which the inverting and non-inverting inputs are equal. The voltages at the inverting and non-inverting inputs are equal when the voltage across precision current sensing resistors 106 and 108 (100 KΩ, 0.05% each) is equal to the voltage across precision resistors 98 and 102, respectively. Resistors 106 and 108 provide the means for determining the amount of current provided by the current generators 70, 72 to the unknown resistance "R".

The output of operational amplifier 96 drives the gates of PFETs 74 and 76. The output of operational amplifier 100 drives the gates of NFETs 80 and 82. The drains of PFETs 74 and 76 are tied together to provide the current to the test resistance "R" through isolation diode 30, and the drains of NFETs 80 and 82 are tied together to provide the current to the test resistance "R" through isolation diode 34.

As described above, the current generators 70, 72 are operated in push-pull mode. That is, current generator 70 sources current (pulls up) at the same time current generator 72 drains current (pulls down). In this manner, the test circuit 10 floats electrically (i.e. independent electrical ground references) with respect to the test resistance "R" so that an in-circuit reading of the resistance "R" may be taken even if one of the sides of resistance "R" is grounded. Moreover, this push-pull configuration of dual current generators permits in-circuit operation of the circuit regardless of the polarity of voltage encountered at the input terminals 30. The disclosed circuit will withstand voltages of either polarity in excess of 900 volts at the input terminals 30, while accurately measuring ohms to the nearest 0.005 Ω (least significant bit) and 10 Ω (most significant bit).

As explained above, the circuit 10 also provides a protection circuit 22 for the current generation circuit 18. The current source protection circuit provides four diodes (two zener diodes 110, 112 and two SB140 Schottky barrier diodes 114, 116) and two 2.2 µF ceramic capacitors 122, 124, which serve as a protection network for the current generators 70 and 72. A 2 KΩ resistor 118 is provided between the positive voltage supply of the circuit 10 and diodes 110 and 114. A similar resistor 120 is provided between the negative voltage supply and diodes 112 and 116.

In addition to the current isolation protection provided by the diodes 32 and 34, the zener diodes 110 and 112 protect the current generation circuit 18 in case the isolation diodes 32, 34 should fail, or if the resistance "R" under test is an open circuit. Diodes 114, 116 clamp the zener voltage to an acceptable limit which is chosen to match the maximum voltage that the current generators can develop across the input terminals 30. The capacitors 66 and 68 lower the AC impedance of the zener voltages so that minimal power is required to protect the current generators.

Accordingly, the preferred embodiment of a high voltage protected in-circuit ohmmeter has been described. With the foregoing description in mind, however, it is understood that this description is made only by way of example, that the invention is not limited to the particular embodiment described herein, and that various rearrangements, modifications, and substitutions may be implemented to the disclosed circuit without departing from the true scope of the invention as defined by the following claims and their equivalents. In particular, although components of the disclosed circuit are described with particularity, it is contemplated that other components which are capable of performing similar functions may be substituted for those components disclosed.

I claim:

1. An in-circuit ohmmeter, comprising:

a pair of input terminals connectable to a resistance of an unknown value;

a pair of current generators connected electrically in series for generating an electrical current to be passed through said unknown resistance to develop a differential voltage across said input terminals;

a circuit for determining the amount of said electrical current passed through said unknown resistance;

a switching circuit for simultaneously switching said pair of current generators on and off; and a differential amplifier circuit for receiving and amplifying said differential voltage so that a value of said unknown resistance may be calculated based on said differential voltage and said determined amount of electrical current passed through said resistance.

2. The ohmmeter of claim 1, further comprising an inverter circuit disposed intermediate said input terminals and an input of said differential amplifier circuit for inverting said differential voltage.

3. The ohmmeter of claim 2, wherein said inverter circuit includes an inverter buffer circuit for electrically isolating said inverter circuit from said from input terminals.

4. The ohmmeter of claim 3, wherein said inverter circuit includes an operational amplifier electrically connected to each of said input terminals, and said inverter buffer circuit comprises a pair of diodes connected across input terminals of each of said operational amplifiers.

5. The ohmmeter of claim 2, further comprising an isolation circuit for electrically isolating said input terminals from said inverter circuit and from said pair of current generators.

6. The ohmmeter of claim 5, wherein said isolation circuit comprises a pair of resistors for electrically isolating each of said input terminals from said inverter circuit and a pair of diodes for electrically isolating each of said input terminals from said pair of current generators.

7. The ohmmeter of claim 2, wherein said switching circuit comprises a semiconductor switch.

8. The ohmmeter of claim 7, wherein said semiconductor switch switches said pair of current generators on and off every 25 µsec.

9. The ohmmeter of claim 1, wherein said ohmmeter floats electrically with respect to said unknown resistance.

10. The ohmmeter of claim 1, further comprising a current generator protection circuit comprising a plurality of diodes connected across said input terminals.

11. An in-circuit ohmmeter, comprising:

a pair of input terminals connectable to a resistance of an unknown value;

a current generation source, comprising a pair of current generators connected electrically in series, for generating an electrical current to be passed through said unknown resistance to develop a differential voltage across said input terminals;

a circuit for determining the amount of said electrical current passed through said unknown resistance;

a switching circuit for simultaneously switching said pair of current generators on and off;

a differential amplifier circuit for receiving and amplifying said differential voltage so that a value of said unknown resistance may be calculated based on said differential voltage and said determined amount of electrical current passed through said resistance; and an isolation circuit for electrically isolating said input terminals from said differential amplifier and from said current generation source.

12. The ohmmeter of claim 11, wherein said isolation circuit comprises a pair of resistors for electrically isolating each of said input terminals from said differential amplifier circuit and a pair of diodes for electrically isolating each of said input terminals from said current generation source.

13. The ohmmeter of claim 11, further comprising a current generation source protection circuit comprising a plurality of diodes connected across said input terminals.

14. The ohmmeter of claim 11, further comprising an inverter circuit disposed intermediate said input terminals and an input of said differential amplifier circuit for inverting said differential voltage.

15. The ohmmeter of claim 14, wherein said inverter circuit includes an inverter buffer circuit for electrically isolating said inverter circuit from said from input terminals.

16. The ohmmeter of claim 15, wherein said inverter circuit includes an operational amplifier electrically connected to each of said input terminals, and said inverter buffer circuit comprises a pair of diodes connected across input terminals of each of said operational amplifiers.

17. The ohmmeter of claim 11, wherein said switching circuit comprises a semiconductor switch.

18. The ohmmeter of claim 17, wherein said semiconductor switch switches said pair of current generators on and off every 25 μsec.

* * * * *

UNITED STATES PATENT AND TRADEMARK OFFICE
CERTIFICATE OF CORRECTION

PATENT NO. : 5,614,832
DATED : March 25, 1997
INVENTOR(S) : Olsen

It is certified that error appears in the above-indentified patent and that said Letters Patent is hereby corrected as shown below:

In the Abstract, line 19: please delete the second occurrence of "from"

Col. 2, line 10: please delete the second occurrence of "from"

Claim 3, Col. 6, line 29: Please delete the second occurrence of "from"

Signed and Sealed this

Fifth Day of August, 1997

Attest:

BRUCE LEHMAN

Attesting Officer

Commissioner of Patents and Trademarks